United States Patent [19]
Trinh et al.

[11] Patent Number: 5,247,213
[45] Date of Patent: Sep. 21, 1993

[54] PROGRAMMABLE SENSE AMPLIFIER POWER REDUCTION

[75] Inventors: Cuong O. Trinh, Daly City; Vincent Win; Mark Kwan, both of Milpitas, all of Calif.

[73] Assignee: Advanced Micro Devices, Inc., Sunnyvale, Calif.

[21] Appl. No.: 520,673

[22] Filed: May 8, 1990

[51] Int. Cl.$^5$ .................... H03K 9/173; H03K 3/01
[52] U.S. Cl. ............................... 307/465; 307/468; 307/296.3
[58] Field of Search ............ 307/465, 468, 469, 279, 307/530, 272.3; 365/185, 205, 227; 364/716

[56] References Cited

U.S. PATENT DOCUMENTS

| | | | |
|---|---|---|---|
| 4,839,539 | 6/1989 | Takata et al. | 307/465 |
| 4,930,098 | 5/1990 | Allen | 307/465 |
| 4,942,319 | 7/1990 | Pickett et al. | 307/465 |
| 4,963,769 | 10/1990 | Hiltpold et al. | 307/465 |
| 4,972,102 | 11/1990 | Reis et al. | 307/530 |

FOREIGN PATENT DOCUMENTS 357213  7/1990  European Pat. Off. .

OTHER PUBLICATIONS

Gowan et al., 12 ns, CMOS Programmable Device for Combinational Applications, Proceedings of IEEE, May 15, 1989, 5.5.1-5.5.4.

Primary Examiner—Edward P. Westin
Assistant Examiner—Andrew Sanders
Attorney, Agent, or Firm—Fliesler, Dubb, Meyer & Lovejoy

[57] ABSTRACT

An apparatus for controlling the power consumption of a programmable logic device which has a plurality of output signals comprising a programmable switch coupled to each one of the logic signal outputs of the programmable logic device. The programmable switch may include a sense amplifier coupled to each one of said logic signal outputs; a first transistor coupled between said amplifier and ground; a latch coupled to the gate of said first transistor; a second transistor responsive to a first control signal; and an electrically erasable programmable read only memory (EEPROM) cell, coupled to said latch and responsive to a second control signal, said second transistor and said EEPROM cell providing a state signal to said latch.

5 Claims, 2 Drawing Sheets

PROGRAMMABLE SENSE AMPLIFIER POWER REDUCTION

FIELD OF THE INVENTION

The invention relates to programmable logic devices, including programmable array logic, programmable logic arrays and programmable read-only memory devices.

BACKGROUND OF THE INVENTION

Programmable logic devices (PLDs) come in a variety of forms including programmable array logic (PAL), programmable read-only memory (PROM), and programmable logic array (PLA). Each of these devices allows the particular user a variety of input and output features, the choice of any particular type of device is dependent upon the particular application.

In all programmable logic devices, common design objectives exist. Specifically, it is desirable for PLD manufacturers to provide the maximum of programming features in a single device utilizing a minimum amount of power to provide those features.

One class of programmable logic devices are comprised of a plurality of input lines, an array of AND gates, and an array of OR gates, with either the AND array, the OR array, or both being programmable. In a PAL, for example, the AND array is programmable and the OR array is fixed. Each array generates logic signal outputs; typically, the outputs of the AND array (referred to as product terms) comprise inputs to the OR plane. Thus, in a PAL, the output of each programmable AND gate in the array of a PAL comprises a product term input to the OR plane.

In conventional PALs, each product term drives one input of an OR or NOR gate. In large programmable arrays, it is desirable to program the input term/product term junctures with a minimum amount of delay. In order to accomplish this, a sense amplifier is coupled at the output of the product term lines to act as a threshold detector. The sense amplifier detects minute changes in voltage on the product term line and outputs a magnified reflection of the threshold change signifying a programmed product term. The output of the sense amplifier thus comprises a high/low input to the OR plane and allows programming of large AND arrays with a minimum amount of delay.

Typically, a programmer will automatically determine which product terms in the array are not required for the particular device application. Such unused product terms must nonetheless be programmed to a particular state to ensure that the unused term does not have an adverse effect as an input to the OR or NOR arrays. Thus, each of the sense amplifiers coupled to a particular product term output constantly draws power in the programmable logic device, whether or not the product term to which it is coupled is used in the application. The power consumed by the sense amplifiers of unused product terms comprises a significant portion of the total power requirement for a particular programmable logic device. The power drawn by the sense amplifier of an unused product term is essentially wasted.

SUMMARY OF THE INVENTION

The invention comprises an apparatus for controlling power consumption of a programmable logic device, the device generating a plurality of logic signals to a plurality of outputs. The apparatus comprises a programmable switch coupled to one of the logic signal outputs of a programmable logic device for selectively enabling the logic signal output. In one embodiment, the programmable switch comprises: an amplifier, coupled to the logic signal output; a first transistor, having a source, drain, and gate electrodes, coupled between said amplifier and ground; a latch, coupled to the gate electrode of the first transistor; a second transistor, responsive to a first control signal; and an electrically erasable programmable read only memory (EEPROM) cell, coupled to said latch and responsive to a second control signal, said second transistor and said EEPROM cell providing a state signal to said latch means.

DETAILED DESCRIPTION OF THE INVENTION

The invention comprises a means for conserving power in a programmable logic device by allowing the device programmer to selectively enable or disable a sense amplifier coupled to a logic signal output in the device. The invention will be described herein with reference to a PAL, however, those skilled in the art will recognize that the invention is applicable in a number of PLD configurations.

Figure 1:
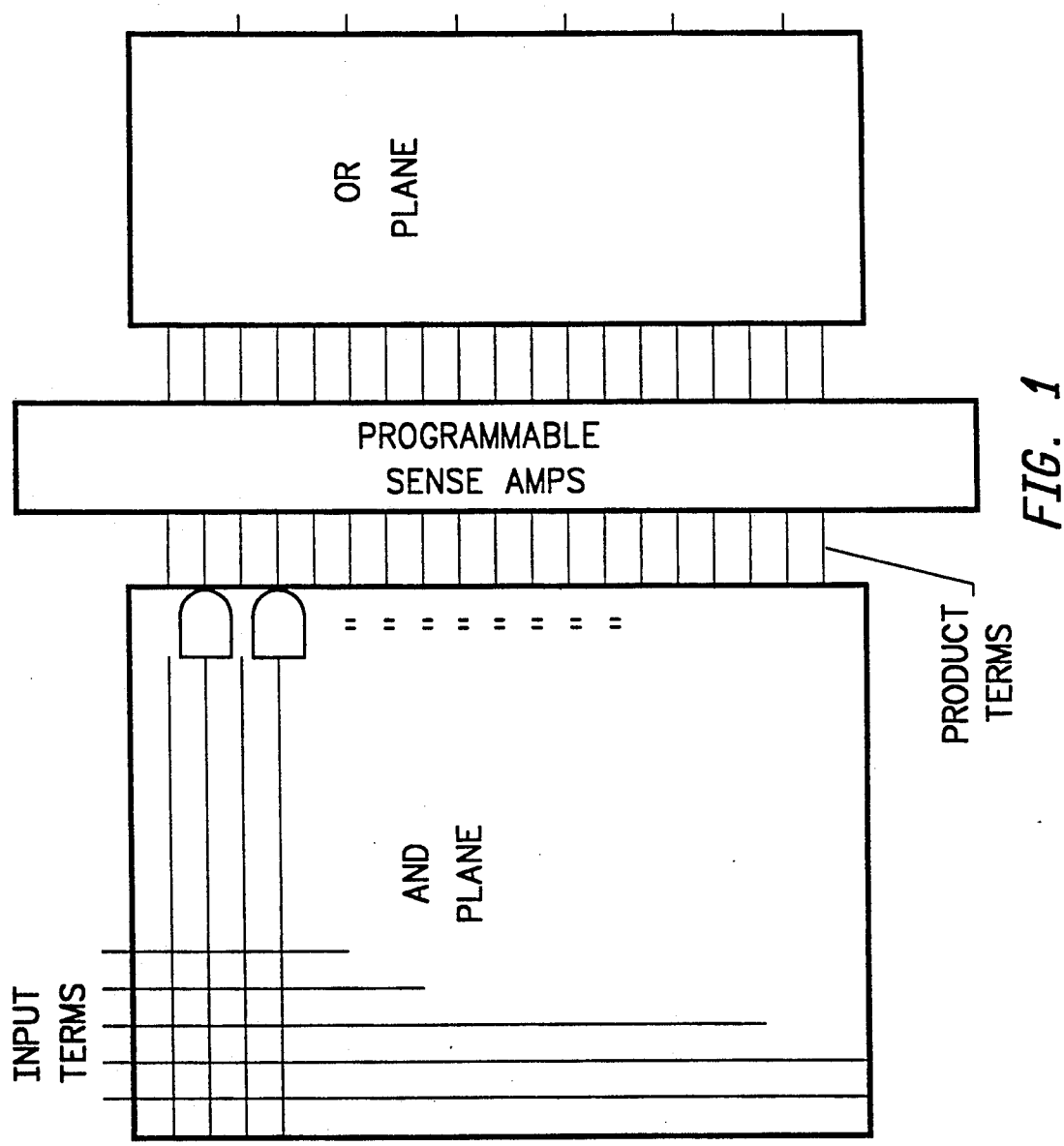
FIG. 1 is a chip level block diagram showing the preferred arrangement of programmable sense amplifiers in a PAL.

FIG. 1 shows the preferred arrangement for the programmable sense amplifier in a PAL device. While the arrangement of sense amplifiers coupled to product term outputs in a PAL is well known as discussed above, prior-art devices provide no means for selectively enabling the sense amplifiers responsive to a specific, separate programming means.

Figure 2:
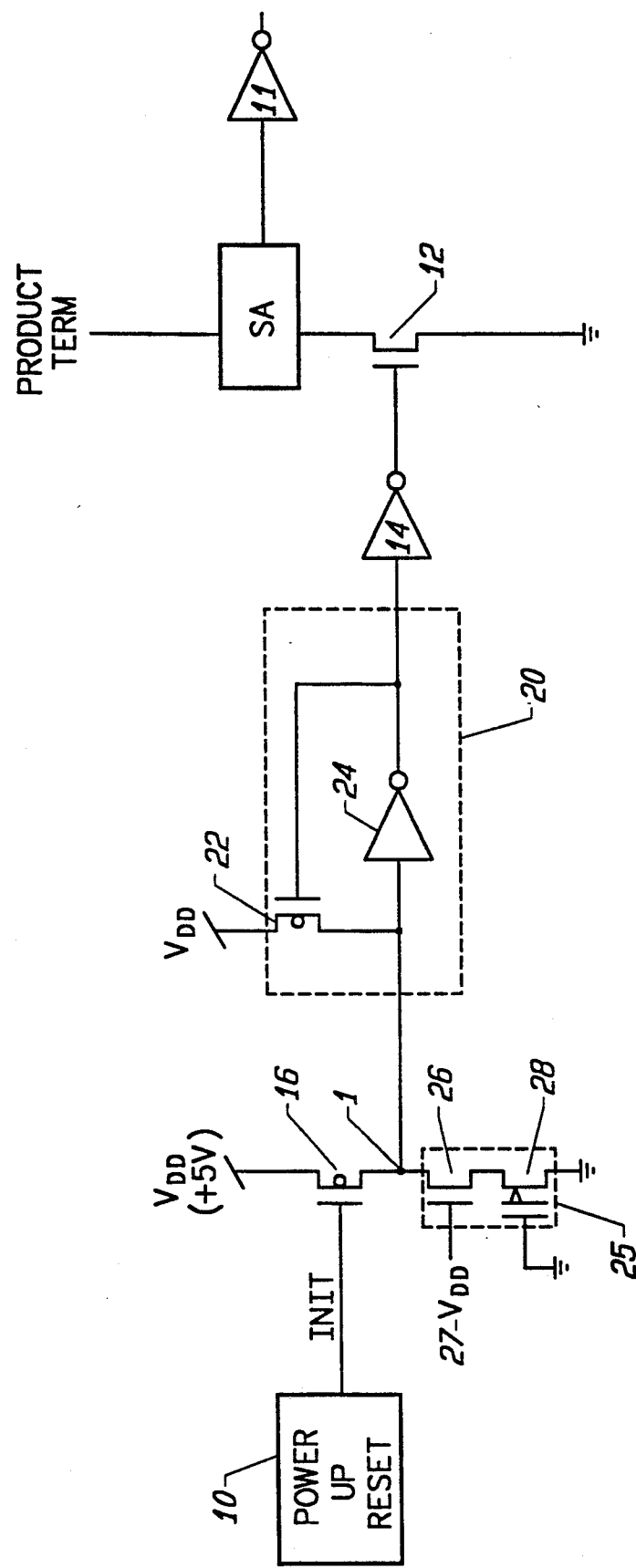
FIG. 2 is a schematic diagram of the preferred embodiment for affecting power reduction in a programmable logic device.

With reference to FIG. 2, the preferred embodiment for implementing the invention is shown.

The product term output is coupled to the input of a sense amplifier SA whose output is coupled through an inverter 11 which is in turn coupled to an input of a NOR gate. (While the conventional PAL described above has been discussed in terms of AND and OR plane arrangements, in the specific embodiment of this invention the PAL is implemented using two NOR planes.) A means for selectively enabling the sense amplifier SA is shown and comprises an N-type transistor 12, an inverter 14, latch means 20, electrically erasable programmable read-only memory (EEPROM) cell 25, P-type transistor 16, and power-up-reset circuit 10.

As discussed above, sense amplifier SA functions as a threshold sensor, producing a usable HI/LO output signal responsive to programming changes of the input line/product term junctions. In the preferred embodiment of the invention, the sense amplifier utilizes a current-sensing structure well known to those skilled in the art. The sense amplifier SA is designed such that its output is at a logic level HI state when no current flows to ground through transistor 12, thus causing the output of inverter 11 to be driven low. In the preferred embodiment of the invention, the product term (output via inverter 11) will thus have no effect on the NOR plane. Any number of current sensing, sense amplifier arrangements are contemplated as being within the scope of the invention, as is the use of a voltage sensing amplifier arrangement.

As is shown in FIG. 2, transistor 12 is coupled between sense amplifier SA and ground. Transistor 12 thus controls the current path for the sense amplifier SA to ground; by disabling the transistor 12, current flow in sense amplifier SA is eliminated.

The gate electrode of transistor 12 is coupled to the output of inverter 14. The input of inverter 14 is coupled to the output of latch means 20. As will be described in more detail below, the latch means stores the select/deselect state of the sense amplifier. The latch means input is coupled to the drain of P-type transistor 16 and the EEPROM cell 25. The source of transistor 16 is coupled to a voltage source $V_{dd}$ typically providing a voltage of approximately 5 volts. The gate of transistor 16 is coupled to and controlled by the INIT signal generated by power-up-reset circuit 10.

In the preferred embodiment of the invention, latch means 20 is comprised of a P-type transistor 22 and an inverter 24, with the drain of transistor 22 coupled to the input of inverter 24, and the gate of transistor 22 coupled to the output of inverter 24. The source of transistor 22 is coupled to $V_{dd}$. However, other types of known latch cells, for example an unbalanced latch, will work equally as well.

Also in the preferred embodiment of the invention, inverter 14 is comprised of a dual input NOR gate with the latch 20 output comprising one input, and an input-transition detection signal comprising the second input to the NOR. However, for purposes of simplicity in explanation, the description refers only to the inverter function.

FIG. 2 also shows the EEPROM cell 25 comprised of a select transistor 26 and a floating gate transistor 28. Those skilled in the art will recognize this as a conventional EEPROM arrangement and EEPROM cell 25 accordingly operates under well-known principles. Programming of the EEPROM cell is accomplished by applying a programming voltage $V_p$ on the order of 15-20V to the gate of the floating gate transistor 28 for a short period of time. In conventional applications, the voltage applied to select transistor 26 via line 27 is controlled in both programming and selecting the cell. During programming, the voltage via line 27 is on the order of 14 volts. In the preferred embodiment of FIG. 2, after power-up of the device, the voltage $V_{dd}$ is continually applied to line 27 at all times other than during programming. Thus, selection/detection of the sense amplifier SA is controlled entirely by whether the EEPROM cell is programmed.

During programming of the programmable logic device, the gate of the floating gate transistor 28 is coupled to ground in conjunction with the application of a high-voltage via line 27 to the gate of transistor 26. This has the effect of discharging the floating gate of transistor 20 and providing a conduction path to ground from node 1. EEPROM 25 thereby supplies a means for selectively setting the state of the latch cell 20, which in turn selects or deselects the sense amplifier SA.

The circuit shown in FIG. 2 operates as follows. Upon power-up of the programmable logic device, the power-up-reset circuit 10 will generate an initialize signal (INIT), but maintains the INIT signal low for approximately 100-200 nanoseconds after power-up of the device. This low period of INIT corresponds to the ramped rise time of $V_{dd}$. If the EEPROM cell is not programmed, during the period while the initialize signal INIT is kept low, the P-type transistor 16 will pull the voltage at node 1 to $V_{dd}$. With node 1 at $V_{dd}$, the output of inverter 24 is driven low, the output of inverter 14 high, and transistor 12 is rendered conductive allowing the sense amplifier SA to couple to ground and current to thus be drawn through the sense amplifier SA. The output of the product term is thus enabled. Once the initial signal INIT goes high, the voltage at node 1 will remain high since the output of inverter 24 is low, leaving transistor 22 conductive and coupling the $V_{dd}$ rail to node 1.

If the programmer wishes to deselect the particular product term sense amplifier SA, the EEPROM cell is programmed as discusses above. With reference to the aforementioned discussion regarding an unprogrammed EEPROM cell, in the case where EEPROM 25 is programmed, once the INIT signal goes high, thereby rendering transistor 16 non-conductive, the voltage at node 1 will be pulled low through the EEPROM cell 25. The output of inverter 24 will then be driven high rendering transistor 22 non-conductive. The output of inverter 14 will, in turn, be driven low, rendering transistor 12 non-conductive thus preventing any current flow in sense amplifier SA and hence any power from being drawn by the sense amplifier SA.

Thus, using the preferred embodiment of the invention, the PLD programmer can identify unused product terms and, by programming the EEPROM cells 25, determine which product term outputs will be required. In this manner, power consumption in the device can be reduced on the order of one-half.

In the preferred embodiment of the invention, it is to be recognized that the components described herein are to be fabricated all on a single chip. However, it is within contemplation of the invention to utilize different components of the invention externally of the chip.

The invention has been described herein with respect to particular embodiments thereof. Numerous variations are possible as will be apparent to a person of ordinary skill in the art after reading the present specification. For example, through the invention has been particularly described with reference to a PAL, those skilled in the art will recognize that the invention is applicable to various particular programmable logic device applications. Furthermore, numerous variations on the particular latch device 20 utilized in the preferred embodiment are available. Specifically within the context of the invention, an unbalanced latch may be substituted for the latch cell 20 shown in the preferred embodiment of the invention. Still further, while particular P- and N-type transistors have been described herein for particular applications, it will be recognized by those skilled in the art that the invention can utilize any combination of P- or N-type transistors. These variations and others are intended to be within the scope of the present invention as defined by the specification and claims.

What is claimed is:

1. An apparatus for selectively enabling a sense amplifier coupled to one of a plurality of logic signal outputs of a programmable logic device upon initializing power to said programmable logic device, comprising:
    means for selectively coupling said sense amplifier to ground responsive to the power-up of said programmable logic device comprising a first transistor coupled between said amplifier and ground; and
    means for controlling said means for selectively coupling, said means for controlling comprising an invertor coupled to said first transistor;

latch means for latching an output state signal, having an input and an ouput coupled to said first invertor, a second transistor, responsive to a first control signal, having a control electrode, and first and second junction electrodes, and being coupled to the latch means, a power-up reset circuit coupled to said control electrode of said second transistor, and an electrically erasable programmable read-only-memory (EEPROM) cell coupled to said first junction electrode of said second transistor and said input of said latch means, and responsive to a second control signal, wherein said second transistor and said EEPROM cell provide a state signal to said latch means.

2. The apparatus of claim 1 wherein said first transistor includes a gate electrode coupled to said latch means.

3. An apparatus for controlling power in programmable array logic devices having a plurality of programmable product terms, comprising:

an amplifier having an input coupled to one of the programmable product term outputs;

a first transistor coupled between said amplifier and ground;

a first invertor coupled to said first transistor;

a latch, including an input and output, the output coupled to said first invertor;

a second transistor, having a source, drain and gate electrode, coupled to said latch means;

a power-up reset circuit coupled to said second transistor; and an electrically erasable programmable read-only-memory cell coupled to said second transistor and said latch;

wherein said gate of said second transistor is coupled to said power-up-reset circuit and said drain of second transistor is coupled to said electrically erasable programmable read-only-memory cell and the input of the latch.

4. The apparatus of claim 3, wherein said electrically erasable programmable read-only-memory cell comprises:

a select transistor coupled to said second transistor and said latch means, and having a source, drain and gate electrodes; and a floating gate transistor coupled between said select transistor and ground.

5. The apparatus of claim 4, wherein said gate of select transistor is coupled to a voltage source.

* * * * *

UNITED STATES PATENT AND TRADEMARK OFFICE
CERTIFICATE OF CORRECTION

PATENT NO. : 5,247,213

DATED : September 21, 1993

INVENTOR(S) : Cuong O. Trinh, Vincent Win, Mark Kwan

It is certified that error appears in the above-identified patent and that said Letters Patent is hereby corrected as shown below:

Col. 4, line 14: Please delete "discusses" and insert therefore --discussed--

Col. 4, line 41: Please delete "through" and insert therefore --though--

Signed and Sealed this

Twenty-second Day of March, 1994

Attest:

BRUCE LEHMAN

Attesting Officer

Commissioner of Patents and Trademarks